United States Patent

Ohkubo et al.

Patent Number: 5,418,181
Date of Patent: May 23, 1995

[54] METHOD OF FABRICATING DIODE USING GRID RECESS

[75] Inventors: Noriyuki Ohkubo; Masamichi Ohmori, both of Toda, Japan

[73] Assignee: Japan Energy Corporation, Tokyo, Japan

[21] Appl. No.: 275,308

[22] Filed: Jul. 15, 1994

[30] Foreign Application Priority Data

Jul. 16, 1993 [JP] Japan .................. 5-197645
May 11, 1994 [JP] Japan .................. 6-120742

[51] Int. Cl.⁶ .......................... H01L 21/762
[52] U.S. Cl. ....................... 437/62; 437/184; 437/902
[58] Field of Search ............ 437/62, 176, 177, 184, 437/226, 902, 904, 966, 974; 148/DIG. 12, DIG. 65, DIG. 135

[56] References Cited

U.S. PATENT DOCUMENTS

| | | | |
|---|---|---|---|
| 3,973,320 | 8/1976 | Greco et al. | 437/902 |
| 4,283,734 | 8/1981 | Espaignol | 437/904 |
| 4,811,079 | 3/1989 | Turina et al. | 437/226 |
| 5,145,809 | 9/1992 | Walker | 437/184 |

FOREIGN PATENT DOCUMENTS 58-40348  9/1983  Japan .
59-21194  5/1984  Japan .

OTHER PUBLICATIONS

Apsley et al., Inst. Phys. Conf. Ser. No. 56: Chapter 7; pp. 483–491; 1981; The Institute of Physics; "Indium Phosphide Millimetere Wave Transferred Electron Oscillators". (no month).

Crowley et al.; Electronics Letters, vol. 16, No. 18, Aug. 28, 1980, pp. 705–706; "High Efficiency 90 GHz InP Gunn Oscillators".

Eddison; Infrared and Millimeter Waves, vol. 11, 1984, pp. 20–23. (no month).

Primary Examiner—Brian E. Hearn
Assistant Examiner—Chandra Chaudhari
Attorney, Agent, or Firm—Sandler, Greenblum & Bernstein

[57] ABSTRACT

Method of fabricating semiconductor devices includes forming an operation layer for forming elements on a first principal plane of a semiconductor substrate; forming a grid recess for separating the elements on the operation layer; forming a support layer in the grid recess; forming independent first electrodes corresponding to the elements, respectively, on the operation layer; removing a second principal plane of the substrate until the bottom of the grid recess is exposed; and etching and removing the operation layer along the grid recess to separate the elements from one another.

20 Claims, 5 Drawing Sheets

METHOD OF FABRICATING DIODE USING GRID RECESS

BACKGROUND OF THE INVENTION

1. Field of the Invention

The present invention relates to a method of forming elements on a semiconductor substrate, thinning the substrate, separating the elements, and fabricating the elements into semiconductor devices. In particular, the present invention relates to a method of efficiently mass-producing Gunn diodes.

2. Description of Background Information

Gunn diodes usually employ one of IHS (Integral Heat Sink) and PHS (Plated Heat Sink) structures that are effective for reducing thermal resistance and for mass production.

FIGS. 1(A) to 1(F) show a method of fabricating the Gunn diodes of IHS structure. This method has been disclosed by N. Apsley et al. in "Indium Phosphide Millimeter Wave Transferred Electron Oscillators" in Inst. Phys. Conf. Ser. No. 56, p. 483, 1981, the disclosure of which is hereby incorporated by reference in its entirety.

In FIG. 1(A), a semiconductor substrate 91 is made from Indium Phosphide (InP). An epitaxial layer 92 of InP is grown to a thickness of several micrometers on a first principal plane of the substrate 91. The epitaxial layer 92 is composed of an active layer and high-concentration impurity layers on each side of the active layer. A first ohmic electrode 93 of Ge—Au—Ni is formed over the epitaxial layer 92. The ohmic electrode 93 and epitaxial layer 92 are etched to form a grid recess 94.

In FIG. 1(B), a thick Ag plated layer 95 is formed to a thickness of about 60 micrometers over the first ohmic electrode 93 and grid recess 94. On top of the plated layer 95, a thin Ni—Ag layer 95' is formed to improve bonding characteristics.

In FIG. 1(C), the plated layer 95 is supported, and a second principal plane of the substrate 91 is ground until the grid recess 94 is exposed.

In FIG. 1(D), a second ohmic electrode 96 is formed over the ground plane. An Au plated layer 97 is formed to a thickness of about 10 micrometers at the center of each square of the grid recess 94.

In FIG. 1(E), the second ohmic electrode 96 around the Au plated layer 97 is removed by chemical etching. The exposed InP area is removed by photoetching, to form mesa structures 98 having vertical side faces on the plated layer 95.

In FIG. 1(F), the plated layer 95 is diced to form individual elements 99, which are packaged into semiconductor devices.

The plated layer 95 of the IHS or PHS structure is as thick and large as the element, so that the dicing process and the processes following it cause a decrease in productivity and yield. Namely, the IHS or PHS structure is improper for mass production.

If the mesa elements are closely arranged at intervals of the width of each element, it will be very difficult to dice them into individual elements.

SUMMARY OF THE INVENTION

An object of the present invention is to provide a method of efficiently mass-producing Gunn diodes.

Another object of the present invention is to provide a method of easily thinning a semiconductor substrate on which individual elements are formed, separating the elements without dicing the substrate, and fabricating semiconductor devices.

In order to accomplish these objects, an aspect of the present invention provides a method of fabricating semiconductor devices, comprising forming an operation layer for forming elements on a first principal plane of a semiconductor substrate; forming a grid recess to separate element regions on the operation layer; forming a support layer in the grid recess, the grid recess having a bottom; forming independent first electrodes corresponding to each of the element regions, respectively, on the operation layer; removing a second principal plane of the substrate until the bottom of the grid recess is exposed; and etching and removing the operation layer along the grid recess to separate the elements from one another.

A mask is used to etch the grid recess, and the same mask is used to form the support layer. The support layer may be a metal layer formed by electrolytic plating.

The operation layer is composed of a pair of electrode contact layers and an active layer therebetween. The support layer short-circuits the electrode contact layers. The first electrodes are preferably formed at least partly by electrolytic plating, and preferably serve for heat radiation.

Second electrodes are formed on the second principal plane of the substrate where the bottom of the grid recess is exposed. The second electrodes are used as a mask to etch and remove the operation layer along the grid recess. The second electrodes are at least partly formed by electrolytic plating.

The elements are fabricated into devices that work in a microwave frequency band or above. In particular, the elements are fabricated into microwave or millimeter wave diodes such as Gunn diodes. The operation layer may be made from compound semiconductor of III-V group, preferably containing InP as a main component.

The grid recess and the operation layer have a depth, and the depth of the grid recess is preferably slightly greater than the depth of the operation layer.

The present invention forms the support layer in the grid recess that defines the element regions, so that the support layer binds the element regions together until the substrate is thinned and fixed to the holder. Etching the substrate separates the element regions from one another while keeping an arranged state on the holder. The substrate is uniformly ground until the bottom of the grid recess is exposed.

It is not necessary to manually separate the thinned elements from one another. The elements are neatly held together. The present invention is appropriate for mass-producing semiconductor devices with fine elements such as the Gunn diodes. The present invention improves yield when elements are fabricated in concentrated conditions.

The support layer, which can be formed by electrolytic plating, has excellent mechanical strength, strongly attaches to the substrate, and easily forms a thick metal layer, to thereby strongly support the elements.

The support layer short-circuits the electrode contact layers, so that no plating current flows through the active layer. Accordingly, the active layer will not be damaged, either electrically or thermally.

After the support layer is formed, the metal layer that forms part of the first electrodes is formed on the first principal plane of the substrate. At least part of the first electrodes is formed by electrolytic plating. The metal layer serves for heat radiation. Since the metal layer is relatively thick to provide excellent thermal conductivity, it improves the thermal circulation of the semiconductor elements.

As discussed above, advantages associated with the present invention include, but are not limited to, the fact that the grid recess is etched with the use of a mask, and this mask is also preferably used to form the support layer, so that no positioning is required after forming the grid recess. It is possible, therefore, to densely form the elements using simple processes. Further, the second metal electrodes are formed on the second principal plane of the substrate and are used as masks when etching and removing the substrate in the vicinities of the grid recess. Accordingly, the elements are formed only in the regions of the electrodes in a self-aligning manner.

Still further, another aspect of the present invention provides a method of fabricating semiconductor devices, comprising forming an operation layer for forming elements on a first principal plane of a semiconductor substrate; forming a grid recess for separating element regions on the operation layer; forming a support layer covering the grid recess; forming independent first electrodes corresponding to each of the element regions, respectively, on the operation layer, while maintaining most of the operation layer between each of said first electrodes and a corresponding grid recess exposed; grinding a second principal plane of the substrate until the bottom of the grid recess is exposed; and fixing the first principal plane to a holder, and removing the operation layer and the substrate along the grid recess to separate the element regions from one another.

This further aspect of the invention can include the structural characteristics and their processes of production, as discussed above with respect to the first aspect of the this invention.

The present invention may employ a semiconductor layer made from compound semiconductor of III–V group, such as that containing InP as a main component, and having low thermal conductivity. This is appropriate for fabricating high-performance devices used in a microwave band and above, such as a millimeter wave band. Such devices include microwave diodes, millimeter wave diodes, and high-power microwave Gunn diodes that produce a large quantity of heat.

BRIEF DESCRIPTION OF THE DRAWINGS

These various objects, features and advantages of the present invention will be more apparent from the following detailed description of preferred embodiments in conjunction with the accompanying drawings, wherein.

DETAILED DESCRIPTION OF THE PREFERRED EMBODIMENTS

Processes of fabricating Gunn diodes according to the first embodiment of the present invention will be explained with reference to FIGS. 2 to 8.

Figure 1A:
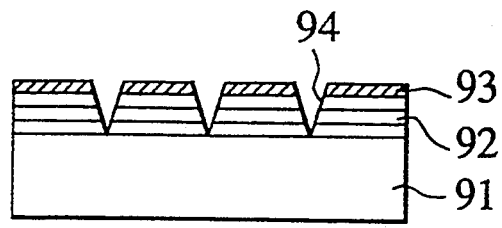
FIGS. 1(A) to 1(F) are sectional views explaining processes of fabricating Gunn diodes of IHS structure according to the prior art.
Figure 1B:
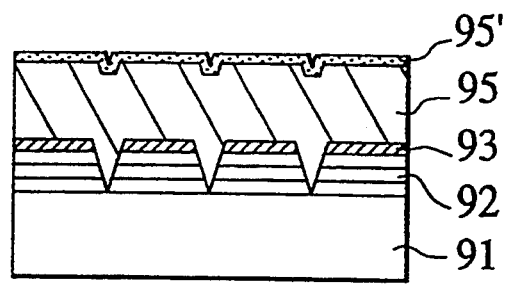
Figure 1C:
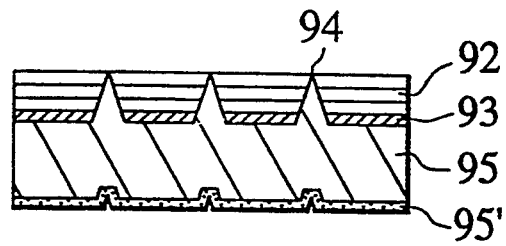
Figure 1D:
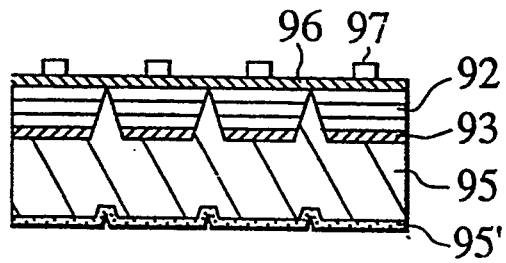
Figure 1E:
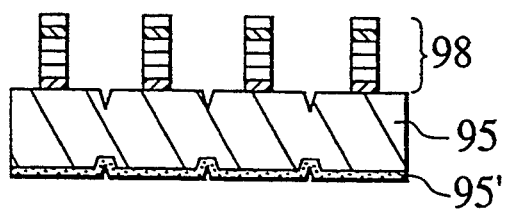
Figure 1F:
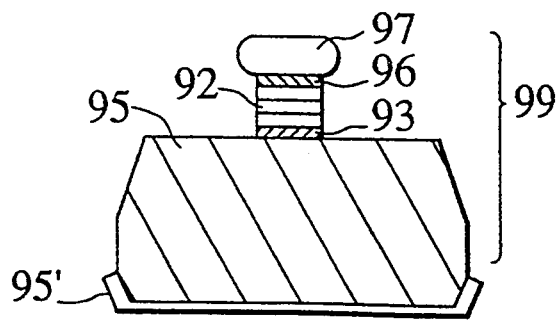
Figure 2:
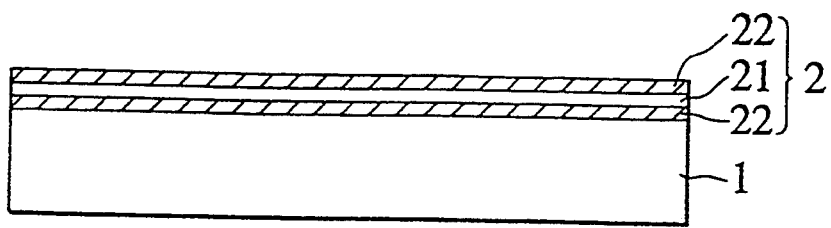
FIGS. 2 to 8 are sectional views explaining processes of fabricating Gunn diodes according to a first embodiment of the present invention.

In FIG. 2, an n-type low-resistance InP substrate 1 has a size of 15-millimeters square and a thickness of 0.4 millimeter. An n-type InP operation layer 2 is epitaxially grown to a thickness of less than or equal to 10 micrometers by metal organic chemical vapor deposition (MOCVD) on a first principal plane of the substrate 1. The operation layer 2 is composed of an active layer 21 and high-concentration impurity layers 22 formed on each side of the active layer 21. The impurity layers 22 are made from n+-type InP and serve as electrode contact layers.

The thickness of the active layer 21 is dependent upon the operation frequency, i.e., oscillation frequency of the Gunn diodes. When the Gunn diodes operate in a 70-GHz band, the thickness is about one micrometer. The carrier concentration of the active layer 21 is usually about 0.5 to $2 \times 10^{16}/cm^3$. To improve oscillation conversion efficiency, the carrier concentration of the active layer 21 should have a concentration gradient in the thickness direction. For example, when the first electrode 31 is a cathode, and the second electrode 81 is an anode, the gradient has an increasing concentration from the cathode to the anode, in which the negative voltage is applied to the cathode and the positive voltage is applied to the anode. The impurity layers (electrode contact layers) 22 function to improve ohmic contact with respect to electrodes. The carrier concentration of the impurity layers 22 is greater than or equal to 2 to $5 \times 10^{18}/cm^3$. The thickness of each of the impurity layers 22 is about one micrometer.

Figure 3:
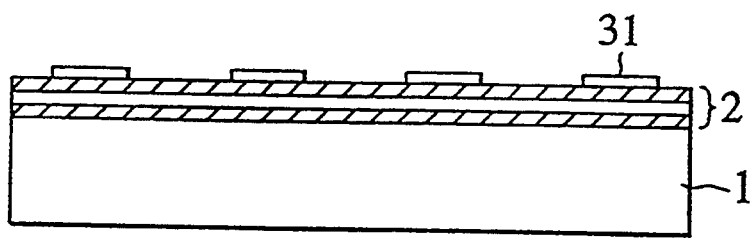

In FIG. 3, first ohmic electrodes 31 are formed on the operation layer 2. The first ohmic electrodes 31 form part of heat radiation first electrodes 3 (FIGS. 5–8). A first photoresist mask (not shown) is formed on the operation layer 2. This mask has circular openings each having a diameter of 220 micrometers. The openings correspond to the first ohmic electrodes 31, respectively. Ohmic metals are deposited over the first photoresist mask. The ohmic metals are AuGe, Ti, and Pt that are sequentially vacuum-deposited to thicknesses of 100 nanometers, 20 nanometers, and 150 nanometers, respectively, to form a metallic multilayer. The first mask is dissolved and removed to form ohmic metal regions each having the desired shape. The ohmic metal regions are heat-treated at 350° C. for 20 seconds, to form the first ohmic electrodes 31.

Figure 4:
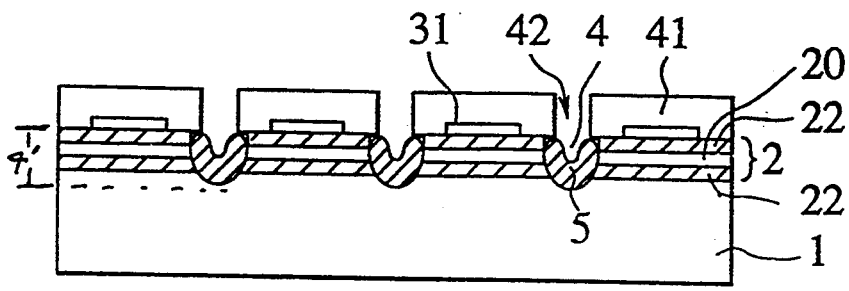

In FIG. 4, a grid recess 4 is formed to separate element regions. A support layer 5 is formed in the grid recess 4 and surrounds each element. Namely, a second photoresist insulation mask 41 is initially formed. The mask 41 has a grid opening 42 corresponding to the grid recess 4 to separate the element regions, each including a first ohmic electrode 31. The grid opening 42 is wet-etched with a Br—HBr-water-based isotropic etching agent to form the grid recess 4. The width of the grid opening 42 is 20 micrometers, and each square of the grid opening 42 spans 300 micrometers. The grid recess 4 has a depth of about 10 micrometers and a width of about 20 micrometers. The depth 4' of the grid recess 4 is slightly greater than the thickness of the operation layer 2.

The second mask 41 is left as it is, and Au is plated to a thickness of about 3.5 micrometers by electrolytic plating to form the support layer 5 in the grid recess 4. A current for the electrolytic plating flows through the low-resistance substrate 1, so that the electrolytic plating starts at the bottom of the grid recess 4 where the substrate 1 is exposed. As the plating progresses, the support layer 5 electrically connects the low-resistance substrate 1 with the high-concentration impurity layer 22 adjacent to the first ohmic electrode 31. After the completion of the plating, the second mask 41 is removed.

Figure 5:
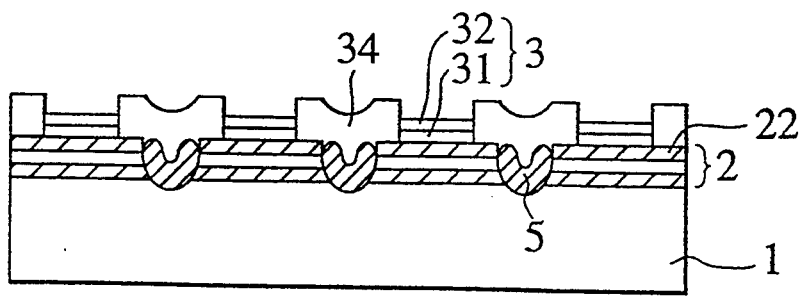

In FIG. 5, an Au plated layer 32 is formed over the first ohmic electrodes 31, to complete the heat radiation first electrodes 3. For this purpose, a third photoresist insulation mask 34 having openings corresponding to the first ohmic electrodes 31 is arranged. With use of the mask 34, the Au plated layer 32 of about 3.5 micrometers thickness is formed on the ohmic electrodes 31 by electrolytic plating. Current for the electrolytic plating is supplied through the low resistance substrate 1 and support layer 5 to the high-concentration impurity layer 22 adjacent to the first ohmic electrodes 31. Accordingly, no current flows through the operation layer 2, so that the operation layer 2 will not be electrically or thermally broken.

The grid recess 4 and support layer 5 may be formed after forming the first ohmic electrodes 31 and Au plated layer 32. This is, however, not preferable because a photoresist mask for forming the grid recess 4 must be formed on the relatively thick Au plated layer 32, so that the flatness of the mask will deteriorate to inaccurately form the grid recess 4.

Figure 6:
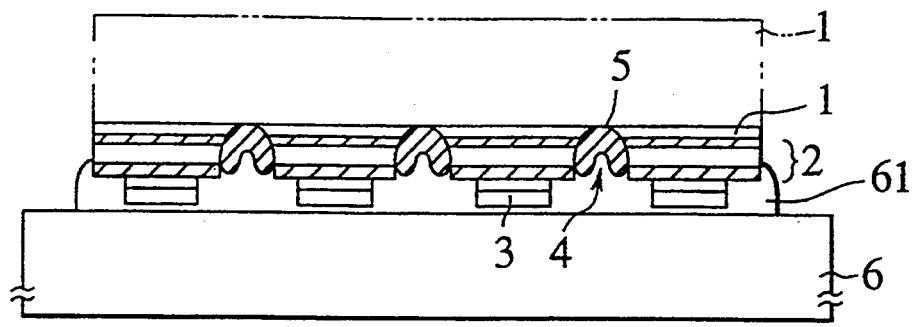

In FIG. 6, the first principal plane of the substrate 1, where the first electrodes 3 are formed, is fixed to a holder (a grinder plate) 6 with bonding wax 61. A second primary plane of the substrate 1 is ground with abrasive alumina grains until the support layer 5 on the bottom of the grid recess 4 is exposed from the second principal plane. The Au plated support layer 5 is slowly ground compared with InP, so that the substrate 1 and operation layer 2 are uniformly ground. The ground layer is thinned by about 0.1 micrometer by entirely wet-etching the second principal plane of the substrate 1 with use of a Br—HBr-water-based isotropic etching agent.

Figure 7:
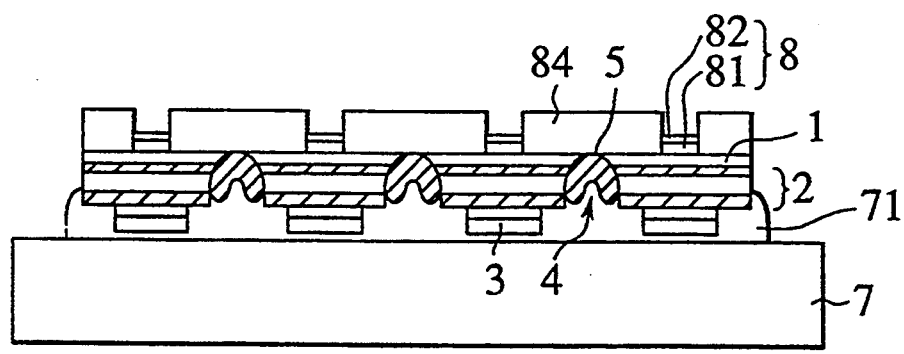

In FIG. 7, the holder 6 is removed, and the first principal plane of the substrate i where the first electrodes 3 are formed is fixed to a holder substrate (glass substrate) 7 with bonding wax 71. Second electrodes (upper electrodes) 8 are formed on the second principal plane. Each of the electrodes 8 is formed of a second ohmic electrode 81 and an Au layer 82.

To form the second electrodes 8, a fourth photoresist mask (not shown) is formed. This mask has circular openings having a diameter of 50 micrometers at positions corresponding to the centers of the heat radiation first electrodes 3, respectively. Ohmic metals are deposited over the mask. The ohmic metals are AuGe, Ti, and Pt, which are deposited to thicknesses of 100 nanometers, 20 nanometers, and 150 nanometers, respectively, to form a metallic multilayer. The fourth mask is dissolved and removed to provide ohmic metals having the desired shapes. The bonding wax 71 is removed because it is not resistive to a high-temperature heat treatment. The ohmic metals are heat-treated at 350° C. for 20 seconds to form the second ohmic electrodes 81.

The first principal plane of the substrate 1 is again fixed to the holder substrate 7 with bonding wax 71, and a fifth photoresist insulation mask 84, which is the same as the fourth photoresist mask, is formed. An Au plated layer 82 of a thickness of about 1.5 micrometers is formed over the second ohmic electrodes 81 by electrolytic plating.

Figure 8:
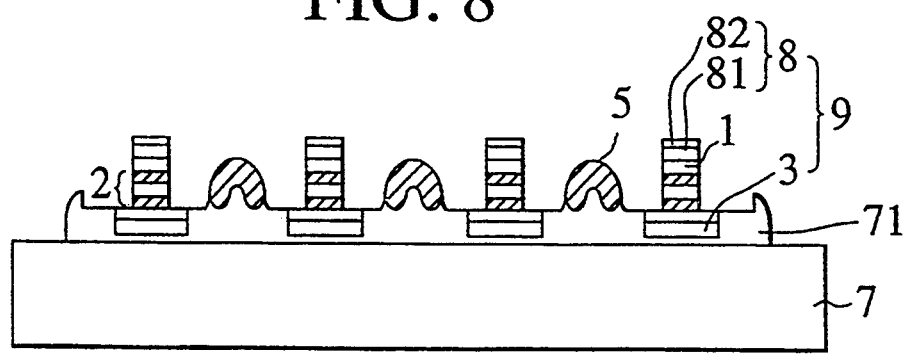

In FIG. 8, the fifth mask 84 is removed. With the first principal plane of the substrate 1 being fixed to the holder substrate 7, areas on the substrate 1 and operation layer 2 wherein the second electrodes 8 are not formed are selectively removed by photoetching. This selective photoetching is carried out by soaking the substrate 1 in a water solution of ferric chloride ($FeCl_3$) and by emitting near ultraviolet rays of about 400 nanometers in wavelength from above the second electrodes 8. As a result, the substrate 1 and operation layer 2 around the second electrodes 8 are substantially removed, and the support layer 5 formed in the grid recess 4 is separated from elements 9 with the bonding wax 71 connecting them together. The elements 9 are aligned on the holder substrate 7 with the bonding wax 71. The bonding wax 71 is removed with a solvent, and the elements 9, i.e., Gunn diodes, are simply picked out of the holder substrate 7 to complete the processes.

To fabricate semiconductor devices, each of the first electrodes 3 is attached to a heat sink of a package.

FIGS. 9(A) to 9(D) show processes of fabricating Gunn diodes according to the second embodiment of the present invention.

Figure 9A:
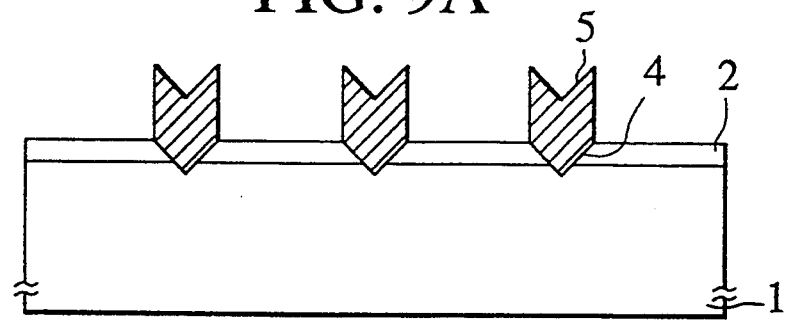
FIGS. 9(A) to 9(D) are sectional views explaining processes of fabricating Gunn diodes according to a second embodiment of the present invention.

In FIG. 9(A), a substrate 1 is made from InP. An operation layer 2 is epitaxially grown to a thickness of about 10 micrometers on the substrate 1 by MOCVD. The operation layer 2 is made of an active layer and high-concentration impurity layers formed on each side of the active layer. A first mask (not shown) is formed on the operation layer 2. The first mask has a grid opening of 20 micrometers in width to separate element regions. The operation layer 2 is wet-etched with a Br—HBr-water-based isotropic etching agent in the grid opening of the first mask to form a grid recess 4. The grid recess 4 is V-shaped and has a depth of about 10 micrometers. Each square of the grid recess 4 spans 150 micrometers. An Au support layer 5 of about 30 micrometers thick is formed in the grid recess 4 by electrolytic plating.

Figure 9B:
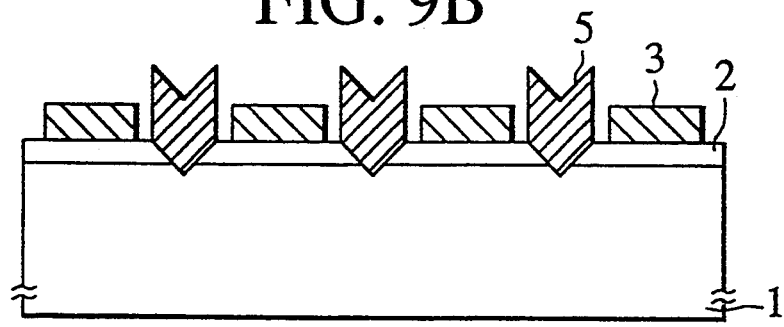

In FIG. 9(B), the first mask is removed, and a second mask (not shown) is formed on the operation layer 2. The second mask has circular openings of. 120 micrometers in diameter at locations where elements are formed. AuGe, Ti, Pt, and electrolytic plating Au are sequentially deposited in the openings of the second mask, to form metallic first electrodes (heat radiation electrodes or lower electrodes) 3. The thicknesses of the layers in this illustrated embodiment are AuGe is about 100 nm, Ti is about 20 nm and Pt is about 150 nm. The Au plated layer is about 30 micrometers thick. As shown in a plan view of FIG. 10, the support layer 5 is independent of the first electrodes 3.

Figure 9C:
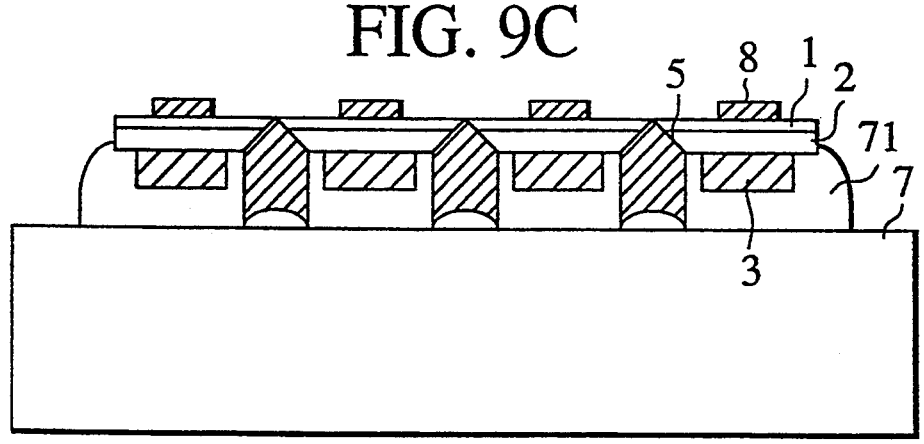

In FIG. 9(C), the first electrodes 3 are fixed to a holder 7 formed of a quartz glass plate with bonding wax 71. A second principal plane of the substrate 1 is ground with abrasive alumina grains until the support layer 5 in the grid recess 4 is exposed. As a result, only the operation layer 2 and thinned substrate 1 are left. A metallic multilayer is formed on the ground plane of the substrate 1. The metallic multilayer is formed by sequentially depositing AuGe, Ti, Pt, and electrolytic plating Au, to provide second circular electrodes (upper electrodes) 8 each having a diameter of 50 micrometers in a desired element shape. The thicknesses of the layers in this illustrated embodiment are AuGe is about 100 nm, Ti is about 20 nm, Pt is about 150 nm, and the Au plated layer is about 30 micrometers thick.

Figure 9D:
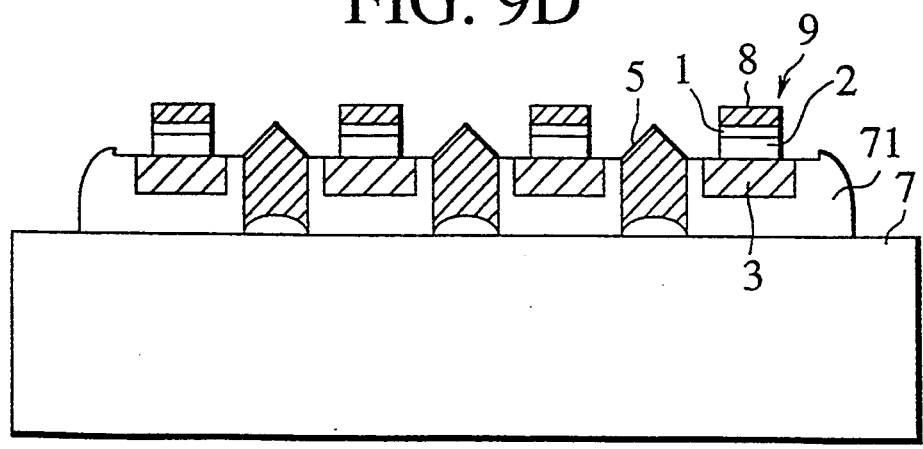

In FIG. 9(D), areas on the operation layer 2 where the second electrodes 8 are not formed are removed by anisotropic RIE (Reactive Ion Etching). As a result, the operation layer 2 around the second electrodes 8 is entirely removed. The support layer 5 formed in the grid recess 4 is separated from the operation layer 2 with the bonding wax 71 binding them together. Elements 9 are aligned on the holder 7 with the first electrodes 3 being spaced apart from the holder 7. The bonding wax 71 is removed with a solvent, and the elements 9 are picked out of the holder 7 and mounted on pill-type packages.

Figure 10:
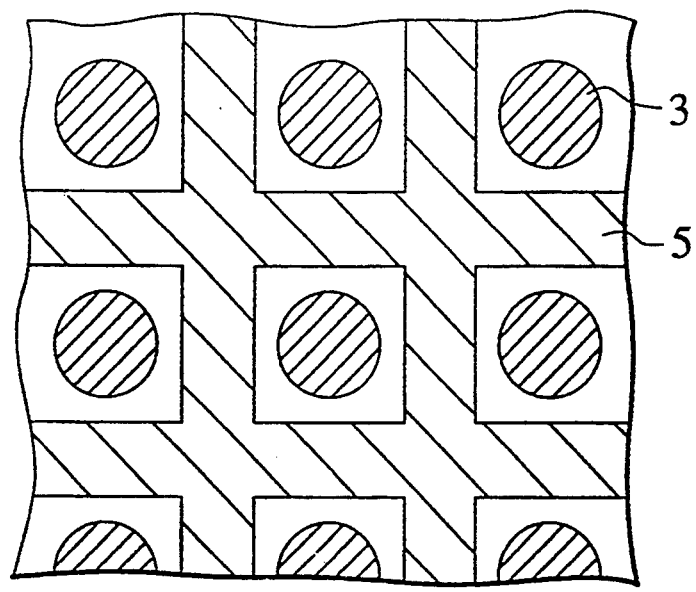
FIGS. 10 and 11 are plan views showing arrangements of a support layer 5 and first electrodes 3 of the Gunn diodes according to the second embodiment of the present invention.
Figure 11:
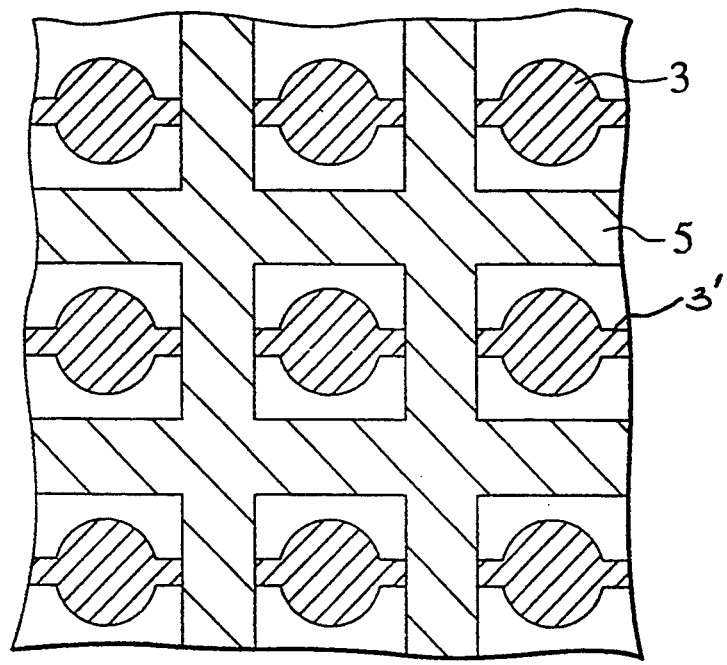

In this embodiment, the support layer 5 is independent of the first electrodes 3, as shown in FIG. 10. They may be partly connected to each other with connections 3' as shown in FIG. 11. For example, the first electrodes 3 can be formed by adding a portion corresponding to the connection 3' to the opening in the second mask. In the opening, the Au support layer 5 is exposed. Therefore, a mechanical contact is achieved via connection 3' between the first electrodes 3 and the support layer 5.

In the embodiment of FIG. 11, the elements 9 may be collectively picked out of the holder 7. Since the connection 3' between the support layer 5 and the first electrodes 3 are relatively weak due to their small dimensions with most of the operation layer 2 being exposed, the elements 9 may be easily removed from one another with a pick-up jig. They, however, will be easily deformed when they are removed from the holder 7, to heat-treat the first electrodes 3. Accordingly, it is preferable to make the support layer 5 independent of the first electrodes 3 as shown in FIG. 10.

The present invention is effective to fabricate not only the Gunn diodes but also microwave diodes such as IMPATT diodes that must have a very fine mesa shape. The present invention is also applicable to semiconductor devices such as Schottky gate field effect transistors that are formed on a thinned semiconductor substrate for heat radiation.

This application is related to Japanese application No. P05-197645, filed Jul. 16, 1993, and Japanese application No. P06-120742, filed May 11, 1994, whose priorities are claimed, and the disclosures of which are incorporated by reference thereto in their entirety.

Various modifications will become possible for those skilled in the art after receiving the teachings of the present disclosure without departing from the scope thereof. In this regard, although the invention has been described with reference to particular means, materials and embodiments, it is to be understood that the invention is not limited to the particulars disclosed and extends to all equivalents within the scope of the claims.

What is claimed:

1. A method of fabricating semiconductor devices, comprising:
   forming an operation layer for forming elements on a first principal plane of a semiconductor substrate;
   forming a grid recess to separate element regions on the operation layer;
   forming a support layer in the grid recess, the grid recess having a bottom;
   forming independent first electrodes corresponding to each of the element regions, respectively, on the operation layer;
   removing a second principal plane of the substrate until the bottom of the grid recess is exposed; and
   etching and removing the operation layer along the grid recess to separate the elements from one another.

2. The method according to claim 1, including forming the grid recess by applying a mask and etching the operation layer, and forming the support layer using the same mask.

3. The method according to claim 2, including electrolytically plating the grid recess with metal to form the support layer.

4. The method according to claim 3, including forming the operation layer with a pair of electrode contact layers and an active layer therebetween, so that the support layer is capable of short-circuiting the electrode contact layers.

5. The method according to claim 4, including forming at least part of the first electrodes by electrolytic plating.

6. The method according to claim 5, wherein the first electrodes partly serve as heat radiation elements.

7. The method according to claim 1, including forming second electrodes on the second principal plane of the substrate where the bottom of the grid recess is exposed.

8. The method according to claim 7, wherein the etching and removing the operation layer along the grid recess to separate the elements from one another comprises etching the operation layer along the grid recess employing the second electrodes as masks.

9. The method according to claim 7, including forming at least part of the second electrodes by electrolytic plating.

10. The method according to claim 1, wherein the elements are devices that are used in a microwave frequency band or above.

11. The method of according to claim 10, wherein the elements comprise a device selected from the group consisting of a microwave diode and a millimeter wave diode.

12. The method according to claim 1, wherein the elements are Gunn diodes.

13. The method according to claim 1, including forming the operation layer with compound semiconductor of III–V group.

14. The method according to claim 1, including forming the operation layer with compound semiconductor of III–V group containing InP as a main component.

15. The method according to claim 1, wherein each of the grid recess and the operation layer have a depth, and the depth of the grid recess is slightly greater than the depth of the operation layer.

16. A method of fabricating semiconductor devices, comprising:
   forming an operation layer for forming elements on a first principal plane of a semiconductor substrate;
   forming a grid recess for separating element regions on the operation layer;
   forming a support layer covering the grid recess;
   forming independent first electrodes corresponding to each of the element regions, respectively, on the operation layer, while maintaining most of the operation layer between each of said first electrodes and a corresponding grid recess exposed;

grinding a second principal plane of the substrate until the bottom of the grid recess is exposed; and fixing the first principal plane to a holder, and removing the operation layer and the substrate along the grid recess to separate the element regions from one another.

17. The method according to claim 16, wherein all of the operation layer between each of said first electrodes and a corresponding grid recess is exposed.

18. The method according to claim 16, wherein, prior to fixing the first principal plane to a holder, forming second electrodes on the second principal plane of the substrate where the bottom of the grid recess is exposed.

19. The method according to claim 18, wherein the removing the operation layer and the substrate comprises etching the operation layer along the grid recess employing the second electrodes as masks.

20. The method according to claim 16, including forming the grid recess by applying a mask and etching the operation layer, and forming the support layer using the same mask.

* * * * *

UNITED STATES PATENT AND TRADEMARK OFFICE
CERTIFICATE OF CORRECTION

PATENT NO. : 5,418,181
DATED : May 23, 1995
INVENTOR(S) : N. OHKUBO et al.

It is certified that error appears in the above-indentified patent and that said Letters Patent is hereby corrected as shown below:

At column 5, line 51, change "i" to ---1---.

At column 6, line 51, change "of." to ---of---.

Signed and Sealed this

Twenty-second Day of October, 1996

Attest:

BRUCE LEHMAN

Attesting Officer        Commissioner of Patents and Trademarks